United States Patent
Guo et al.

(10) Patent No.: US 10,014,951 B2
(45) Date of Patent: Jul. 3, 2018

(54) WAVELENGTH LOCKING AND MULTIPLEXING OF HIGH-POWER SEMICONDUCTOR LASERS

(71) Applicant: Lumentum Operations LLC, Milpitas, CA (US)

(72) Inventors: James Yonghong Guo, Union City, CA (US); Lei Xu, San Jose, CA (US)

(73) Assignee: Lumentum Operations LLC, Milpitas, CA (US)

( * ) Notice: Subject to any disclaimer, the term of this patent is extended or adjusted under 35 U.S.C. 154(b) by 205 days.

(21) Appl. No.: 15/173,235

(22) Filed: Jun. 3, 2016

(65) Prior Publication Data

US 2017/0063468 A1  Mar. 2, 2017

Related U.S. Application Data

(63) Continuation of application No. 14/522,836, filed on Oct. 24, 2014.

(51) Int. Cl.
| | |
|---|---|
| *H01S 5/068* | (2006.01) |
| *H04B 10/572* | (2013.01) |
| *H04J 14/02* | (2006.01) |
| *H04B 10/50* | (2013.01) |
| *H01S 5/14* | (2006.01) |
| *H01S 5/40* | (2006.01) |
| *H01S 5/022* | (2006.01) |

(52) U.S. Cl.
CPC .......... *H04B 10/572* (2013.01); *H01S 5/141* (2013.01); *H01S 5/4062* (2013.01); *H04B 10/503* (2013.01); *H04B 10/506* (2013.01); *H04J 14/02* (2013.01); *H01S 5/02252* (2013.01); *H01S 5/146* (2013.01); *H01S 5/4068* (2013.01); *H01S 5/4087* (2013.01)

(58) Field of Classification Search
CPC ...... H01S 5/068; H01S 5/4031; H01S 5/4062; H01S 5/065; H01S 5/1206; H01S 5/1215; H01S 3/08009; H01S 3/0812
See application file for complete search history.

(56) References Cited

U.S. PATENT DOCUMENTS

| | | |
|---|---|---|
| 4,978,197 A | 12/1990 | Horikawa |
| 5,691,989 A | 11/1997 | Rakuljic et al. |
| 6,041,072 A | 3/2000 | Ventrudo et al. |
| 6,898,222 B2 | 5/2005 | Hennig et al. |
| 7,167,490 B2 | 1/2007 | Mehuys et al. |
| 7,212,554 B2 | 5/2007 | Zucker et al. |
| 7,668,214 B2 | 2/2010 | Wilson et al. |
| 7,733,932 B2 | 6/2010 | Faybishenko |
| 7,773,655 B2 | 8/2010 | Chuyanov et al. |
| 8,427,749 B2 | 4/2013 | Du et al. |
| 8,437,086 B2 | 5/2013 | Du et al. |
| 2016/0119063 A1 | 4/2016 | Guo et al. |

*Primary Examiner* — Marcia Golub-Miller
(74) *Attorney, Agent, or Firm* — Harrity & Harrity, LLP

(57) ABSTRACT

The invention relates to wavelength stabilization and wavelength multiplexing of multiple high-power multi-mode semiconductor lasers. The lasers are wavelength-stabilized in free space using multi-peak output reflectors to wavelength-lock their output at different reflection wavelength in dependence on operating conditions, to reduce output reflectivity required for locking and increase output power. Selecting output reflectors having different non-overlapping sets of reflectivity peaks for different lasers or groups of lasers enables combining their output by wavelength multiplexing.

16 Claims, 10 Drawing Sheets

WAVELENGTH LOCKING AND MULTIPLEXING OF HIGH-POWER SEMICONDUCTOR LASERS

RELATED APPLICATION

This application is a continuation of U.S. patent application Ser. No. 14/522,836, filed Oct. 24, 2014, which is incorporated herein by reference.

TECHNICAL FIELD

The present invention generally relates to semiconductor laser devices, and more particularly relates to stabilizing the wavelength of high-power multi-mode semiconductor lasers and groups thereof over a wide range of operating parameters using multi-peak reflectors, and to wavelength multiplexing of multi-laser light sources including multi-peak reflectors.

BACKGROUND OF THE INVENTION

Semiconductor laser diodes have a high electrical-to-optical conversion efficiency, and can presently achieve optical power levels of a few Watts or even tens of Watts per single emitter laser diode, and tens to hundreds of Watts when manufactured as laser arrays. Due to high efficiency, reasonable power levels, and high spectral and directional brightness, laser diodes find applications in many areas, such as material processing, offset printing, medical treatment, pumping of solid state lasers, and pumping of fiber lasers.

Still, some applications require optical powers even greater than those that can be obtained from a single laser emitter. Many applications further require that the output light from a laser source be provided as a single optical beam, for example for coupling into an optical fiber, which generally has a substantially circular or polygonal cross-section and has a substantially symmetrical acceptance angle. To obtain the highest brightness out of the fiber, light beams from multiple single emitter diode lasers are coupled into a single fiber either intermixed, for example using a multi-mode beam combiner as disclosed for example in U.S. Pat. No. 7,212,554 that is incorporated herein by reference, or stacked in their fast axis direction, as described for example in U.S. Pat. Nos. 6,898,222, 7,668,214, 7,733,932, 7,773,655, and 8,427,749, all of which are incorporated herein by reference. For example, an array of 3-10 individual laser emitters with a 100 micrometers (um) aperture width in the slow axis can be coupled into a fiber with a 105 um diameter and 0.15 NA (numerical aperture) by stacking individual laser beams in the fast axis direction.

There is however a limit how many laser beam can be stacked for efficiently coupling into a fiber. Since the diode laser emission is typically polarized, polarization beam combining may be used to couple light emitted by two arrays of single emitters into a single fiber, thereby doubling the power and brightness of the output beam. Examples of such laser beam combining devices, which incorporates both the spatial stacking of equally polarized laser beams with polarization multiplexing of stacked beams from two laser arrays, are disclosed in U.S. Pat. No. 4,978,197 and U.S. Pat. No. 8,427,749, which is incorporated herein by reference.

Some application further require that the output laser beam is wavelength-stabilized, to prevent the optical spectrum of the beam to wonder with changes in injection current, operating temperature, or due to uncontrolled back reflections. One conventional way to achieve such wavelength stabilization is to use an external reflector with a narrow reflection band, to provide a wavelength-selective optical feedback to the laser at a level that is suitable to effectively lock the laser spectrum to the narrow reflection band of the external reflector. For example, U.S. Pat. No. 6,041,072 discloses an arrangement where output light from multiple laser diodes emitting at different wavelengths is coupled into a single-mode optical fiber using wavelength multiplexers, and the lasers are individually stabilized using multiple fiber Bragg gratings (FBGs) formed in the fiber. U.S. Pat. No. 7,212,554 discloses using a volume Bragg grating (VBG) to stabilize multiple lasers which output beams are first intermixed and combined in a single beam using a multimode combiner. U.S. Pat. No. 8,427,749 discloses using a VBG in the optical path of vertically-stacked beams from a plurality of laser diodes.

One drawback of using external reflectors for wavelength stabilization is that returning a portion of the laser light back into the laser cavity reduces the useful output power from the light source. This drawback worsens when the lasers are to be stabilized over a wide range of operating parameters and laser characteristics that affect the spectral position of the optical gain peak in the laser, necessitating higher reflectivity of the grating to affect a sufficiently broad range of wavelength locking.

Accordingly, a need exists for providing high-power wavelength-stabilized laser modules and methods for providing high-brightness optical beams that obviate at least some of the disadvantages of the prior art.

SUMMARY OF THE INVENTION

Accordingly, the present invention, in one aspect thereof, relates to wavelength stabilization of light sources comprising high-power multi-mode semiconductor lasers in a pre-defined range of operating conditions using free-space multi-peak partial reflectors, such as multiple volume Bragg gratings, which are disposed in the optical path of an output light beam so as to provide wavelength-locking optical feedback to the laser or lasers at a set of two or more pre-defined reflection wavelengths; the reflection wavelengths are spread within an operating wavelength range of the laser or lasers so as to lock their output to different reflection wavelengths as the operating conditions vary across the pre-defined range. A further aspect of the invention relates to a method of combining light beams from two such light sources by wavelength multiplexing of the multi-wavelength stabilized light beams, which comprises selecting two different non-overlapping sets of the pre-defined reflection wavelengths for the wavelength locking of the two light sources so as to enable the wavelength multiplexing.

One aspect of the present invention relates to a multi-laser light source comprising: a plurality of multi-mode semiconductor lasers; beam combining optics for combining multi-mode laser beams emitted by the multi-mode semiconductor lasers into a single combined multi-mode beam; and, a multi-band partial reflector (MBPR) disposed in the optical path of the combined multi-mode beam for transmitting therethrough at least 80% of an optical power of the combined multi-mode beam, the MBPR having at least two distinct reflectivity peaks centered at least two distinct reflection wavelengths, each reflectivity peak characterized by a peak reflectivity in the range of 1% to 15% for providing an optical feedback to each of the plurality of semiconductor lasers at the at least two distinct reflection wavelengths. The at least two reflection wavelengths and the corresponding peak reflectivities are selected so as to enable wavelength locking of each of the semiconductor lasers at one of the at least two reflection wavelengths at any operating condition within a pre-defined range of operating conditions.

Another feature of the present invention provides a wavelength multiplexed light source, comprising: a first multi-laser light source as described hereinabove for generating a first composite multi-mode light beam; a second multi-laser light source as described hereinabove for generating a second composite multi-mode light beam; and, a wavelength multiplexer disposed to receive the first and second composite light beams to produce therefrom a single multiplexed beam by means of wavelength division multiplexing. The at least two distinct reflection wavelengths of the MBPR of the first multi-laser light source differ from the at least two distinct wavelengths of the MBPR of the second multi-laser light source so as to enable the wavelength division multiplexing thereof by the wavelength multiplexer.

One aspect of the present invention relates to a method of wavelength stabilization of a multi-laser light source wherein multi-mode laser beams from a plurality of multi-mode semiconductor lasers are combined into a composite multi-mode beam. The method comprises: providing a multi-band partial reflector (MBPR) having at least two distinct reflectivity peaks centered at least two distinct reflection wavelengths within an operating wavelength range of the light source, each reflectivity peak characterized by a peak reflectivity in the range of 1% to 15%, and disposing the MBPR in the optical path of the composite multi-mode beam for transmitting therethrough at least 80% of an optical power of the composite multi-mode beam, and for providing an optical feedback to each of the plurality of multi-mode semiconductor lasers at the at least two distinct reflection wavelengths substantially without cross-coupling. The at least two distinct reflection wavelengths and the corresponding peak reflectivities are selected so as to enable wavelength locking of each of the multi-mode semiconductor lasers at one of the at least two reflection wavelengths at any operating condition within a pre-defined range of operating conditions.

A further aspect provides a method of producing a high-power light beam by wavelength multiplexing, comprising: a) combining multi-mode laser beams from a plurality of first multi-mode semiconductor lasers to produce a first multi-mode composite light beam; b) combining multi-mode laser beams from a plurality of second multi-mode semiconductor lasers to produce a second multi-mode composite light beam; c) disposing a first MBPR in the optical path of the first multi-mode composite light beam for providing an optical feedback to each of the plurality of first multi-mode semiconductor lasers at least two first reflection wavelengths that are spaced apart by at least 2 nm, wherein the at least two first reflection wavelengths and corresponding peak reflectivities of the first MBPR are selected so as to ensure wavelength locking of each of the first semiconductor lasers at one of the at least two first reflection wavelengths at any operating condition within a pre-defined range of operating conditions; d) disposing a second MBPR in the optical path of the second multi-mode composite light beam for providing an optical feedback to each of the plurality of second multi-mode semiconductor lasers at least two second reflection wavelengths that are spaced apart by at least 2 nm, wherein the at least two second reflection wavelengths and corresponding peak reflectivities of the second MBPR are selected so as to ensure wavelength locking of each of the second semiconductor lasers at one of the at least two second reflection wavelengths at any operating condition within the pre-defined range of operating conditions, wherein each of the at least two first reflection wavelength is spaced apart from each of the at least two second reflection wavelengths so as to enable wavelength multiplexing of the first and second reflection wavelengths; and, e) providing a wavelength multiplexer disposed to receive the first and second multi-mode composite light beams to produce therefrom the high power light beam by means of wavelength division multiplexing of the first and second multi-mode composite light beams.

BRIEF DESCRIPTION OF THE DRAWINGS

The invention will be described in greater detail with reference to the accompanying drawings which represent preferred embodiments thereof, in which like reference numerals indicate like elements, and wherein.

DETAILED DESCRIPTION

Figure 1:
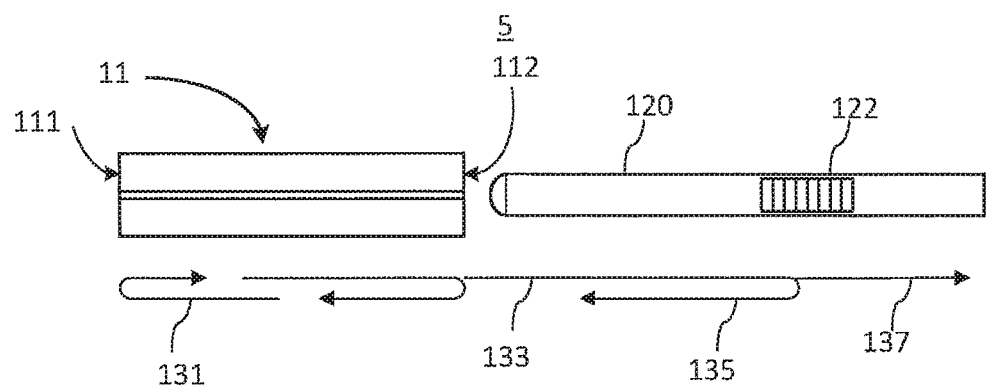
FIG. 1 is a schematic diagram illustrating a fiber-coupled semiconductor laser based optical pump source including an FBG in an output fiber pigtail for wavelength stabilization according to prior art.

In the following description, for purposes of explanation and not limitation, specific details are set forth, such as particular optical components, circuits, assemblies, techniques, etc. in order to provide a thorough understanding of the present invention. However, it will be apparent to one skilled in the art that the present invention may be practiced in other embodiments that depart from these specific details. In other instances, detailed descriptions of well-known methods, devices, components and circuits are omitted so as not to obscure the description of the present invention.

Note that as used herein, the terms "first", "second" and so forth are not intended to imply sequential ordering, but rather are intended to distinguish one element from another unless explicitly stated. The terms "horizontal" and "vertical" are used with respect to a plane of a semiconductor laser substrate, and may also refer to directions with respect to the plane of the sheet where it doesn't lead to a confusion. The terms "connect," "couple," "mount" and similar terms with their inflectional morphemes do not necessarily denote direct and immediate connections, but also include connections through mediate elements or devices, unless explicitly stated otherwise. The terms "wavelength stabilization" and "wavelength locking" are used herein interchangeably to describe a condition when an output spectrum of an light source is limited to a narrow wavelength band centered at a specific wavelength or at one of a several distinct pre-determined wavelengths across a range of operating conditions. The terms "operating wavelength range" and "wavelength operating range" are used interchangeably to mean a full wavelength range wherein the "free-running" output wavelength or wavelengths of a laser source may vary within the pre-defined range of operating conditions. The term "free-running" refers to a laser source and/or the central wavelength of its output light in the absence of wavelength stabilization by a frequency-selective reflector external to the laser. Terms 'semiconductor laser" (SL) and "laser diode" (LD) may be used herein interchangeably. The term 'multi-mode', when used with reference to a laser, refers to spatial, e.g. lateral, modes of the laser waveguide rather than longitudinal modes of the laser cavity.

Various aspects of the present invention relate to wavelength stabilization of semiconductor lasers, and in particular to wavelength stabilization of high-power multi-mode semiconductor lasers having a broad, i.e. 10 um or wider, active area. Certain applications, such as optical pumping of solid state lasers or amplifiers, require wavelength-stabilized light sources that generate light at a substantially same wavelength, for example with deviations within about a nanometer (nm) or, preferably within ~0.5 nm or less, in a wide range of operating conditions, such as laser temperature, drive current and/or output power. However, many types of semiconductor lasers, especially those with a Fabry-Perot (FP) type laser cavity, are known to exhibit significant variations in their output wavelength in the absence of specific measures to stabilize their output optical spectrum. Such variations may be caused for example by accidental optical feedback into the laser cavity due to uncontrolled back reflections from external optics, or due to changes in the operating temperature of the laser or in the laser drive current.

FIG. 1 schematically illustrates one conventional wavelength-stabilization arrangement based an external fiber Bragg grating (FBG), as used for example in laser pump sources for pumping fiber-optic lasers and amplifiers. The figure shows a semiconductor laser-based pump source 5, wherein an output facet 112 of a Fabry-Perot single-mode type semiconductor laser 11 is coupled to a lensed proximal end of a single-mode optical fiber pigtail 120. An FBG 122 is formed within the fiber pigtail 120 at some distance along its length from the lensed laser-coupled end of the fiber, typically from a few centimeters to about a meter. A back facet 111 of the laser 11 typically has a high-reflection HR coating. The output facet 112 may have a low-reflection (AR) coating to reduce, but typically not eliminate, reflection of the laser light 131 generated within the laser cavity back into the laser 11.

Figure 2:
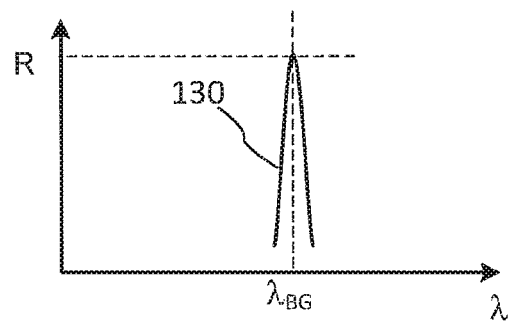
FIG. 2 is a schematic plot of a reflection spectrum of a conventional single-period Bragg grating.

Referring now also to FIG. 2, the FBG 122 typically has a single grating period that defines a Bragg wavelength $\lambda_{BR}$, and a narrow reflection peak 130 that is centered at the Bragg wavelength $\lambda_{BR}$. A peak reflectivity R of the reflection peak 130 is typically selected for reflecting a relatively small portion 135 of the output laser light 133 back into the laser 11. The remaining light 137 that is transmitted through the FBG 122 forms the useful output of the pump device 5.

The return of a small fraction of the output light back into the laser cavity slightly reduces effective optical loss in the laser cavity at $\lambda=\lambda_{BR}$, effecting the laser wavelength stabilization at the Bragg wavelength $\lambda_{BR}$. The grating-induced reduction $\Delta L$ in the optical loss in the laser is approximately proportional to a fraction r of the output light that is returned back into the laser cavity, $$\Delta L \sim r = R \cdot \beta, \quad (1)$$

where R is the FBG peak reflectivity, and $\beta$ is the coupling efficiency of the optical feedback, i.e. a fraction of the returned light 135 that is coupled back in to the laser cavity. Parameter r may also be referred to herein as the optical feedback coefficient.

One drawback of the laser pump source of FIG. 1 is that it typically requires that the laser 11 and the optical fiber of the fiber pigtail 120 are both single-mode, at least for the reason that mode mixing in multi-mode fibers results in a much lower feedback efficiency for a given grating reflectivity, in addition to difficulties in writing high quality Bragg gratings in multi-mode fibers. Another and related drawback of the laser pump source of FIG. 1 is that combining light from several lasers to obtain greater beam power requires polarization and/or wavelength multiplexing, and thus typically requires a different grating for each laser.

Yet another drawback of the FBG-stabilized laser pump source of FIG. 1 relates to the need to have a relatively high FBG reflectivity when the laser has to be stabilized over a broad range of operating conditions, which reduces the useful output power of the source.

Indeed, the FBG 122 stabilizes the optical spectrum of the pump 5 at or near the Bragg wavelength $\lambda_{BR}$ of the FBG 122, typically within a few tenths of a nanometer (nm), provided that the optical gain peak wavelength $\lambda_G$ of the laser is within a locking range from $\lambda_{BR}$. However, the gain peak wavelength $\lambda_G$ depends on operating conditions of the laser, and for example changes when one or both of the laser temperature T or the laser drive current J change. When the gain peak wavelength $\lambda_G$ moves outside the locking range, a loss of the wavelength locking may occur.

Figure 3:
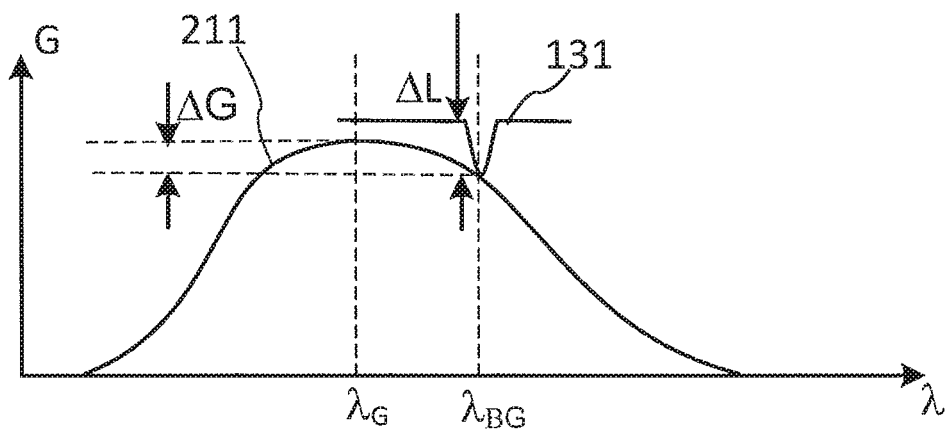
FIG. 3 is a diagram schematically illustrating gain and loss spectra of a semiconductor laser coupled to a conventional single-wavelength Bragg grating.

FIG. 3 schematically illustrates (not to scale) a laser cavity loss spectrum 131, which has a narrow minimum at $\lambda_{BR}$ due to the optical feedback from the FBG 122, relative to the wavelength spectrum $G(\lambda,T)$ of the optical gain in the laser 110, at operating conditions for which the Bragg wavelength $\lambda_{BR}$ of the FBG 122 differs from the gain peak wavelength $\lambda_G$. Note that the notation $G(\lambda,T)$ explicitly shows the dependence of the laser gain on the laser temperature and not on other parameters, such as for example laser drive current J, by way of example only. The laser wavelength $\lambda$ will be "locked" to the Bragg wavelength $\lambda_{BR}$ as long as the difference $\Delta G(T)=(G_p(T)-G(\lambda_{BR},T))$ between the peak gain value $G_p(T)=G(\lambda_G,T)$ and the optical gain at the Bragg wavelength $G(\lambda_{BR},T)$ is smaller than the feedback-induced change in the cavity loss $\Delta L$, i.e.

$$\Delta G(T)<\Delta L, \qquad (2)$$

If the operating conditions change so that the optical gain deficit $\Delta G(T)$ at the reflection wavelength $\lambda_{BR}$ becomes greater than the grating-related decrease $\Delta L$ in the optical loss in the laser cavity, the lasing at the grating wavelength $\lambda_{BR}$ may become unstable, and the lasing wavelength may jump to a new wavelength near the gain peak wavelength $\lambda_G$. As can be seen from expressions (1) and (2), the width of the wavelength locking range $\Delta\lambda_{lock}$ depends on the peak reflectivity R of the grating 122 and may be increased by using a higher reflectivity grating.

The wavelength locking range $\Delta\lambda_{lock}$ for the FBG-coupled laser 110 is defined hereinabove in terms of a deviation of the FBG reflection wavelength $\lambda_{BR}$ from the gain peak wavelength $\lambda_G$. The wavelength locking range $\Delta\lambda_{lock}$ may also be conveniently defined in terms of a deviation of the FBG reflection wavelength $\lambda_{BR}$ from the free-running laser wavelength $\lambda_0$, as the later tracks changes in $\lambda_G$. The free-running laser wavelength $\lambda_0$ is understood herein as the wavelength at which the laser operates when the external optical feedback is not frequency selective. It may be approximately estimated from the lasing wavelength $\lambda_{00}$ of the laser 110 in the absence of the external optical feedback.

Figure 4:
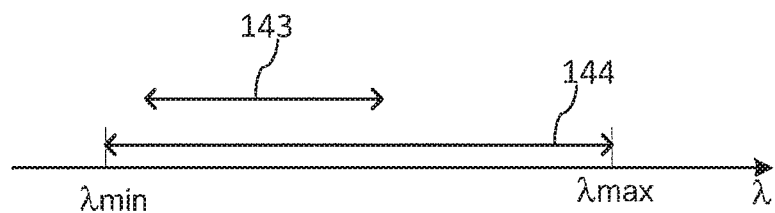
FIG. 4 is a schematic diagram illustrating wavelength locking range provided by a single-period FBG relative to an operating wavelength range of a semiconductor laser.

Referring next to FIG. 4, certain application requires a wavelength stabilization that persists across a specific, usually pre-defined, range of operating conditions, such as specific ranges of laser temperature T and drive current J or output power P. This issue may be addressed by comparing a wavelength locking range 143 of width $\Delta\lambda_{lock}$ with the width $\Delta\lambda_{op}$ of the operating wavelength range 144 of the laser; it is generally desirable that $\Delta\lambda_{lock}$ is at least as great as the operating wavelength range $\Delta\lambda_{op}$. If $\Delta\lambda_{lock}<\Delta\lambda_{op}$, as illustrated in FIG. 4 by way of example, the wavelength stabilization will be lost for at least some combinations of operating conditions. The operating wavelength range $\Delta\lambda_{op}$ is understood herein as the full range of variations of the gain peak wavelength $\lambda_G$, or of the free-running laser wavelength $\lambda_0$, within the pre-defined range of operating conditions, e.g. when the laser temperature T and drive current J span from the minimum specified laser temperature Tmin to the maximum specified laser temperature Tmax, and from the minimum specified drive current Jmin to the maximum specified drive current Jmax.

By way of example, for an FBG with a peak reflectivity of ~10% the locking range 143 may be about 5 to 15 nm wide, depending on the laser and coupling parameters such as the front facet reflectivity and the fiber-laser coupling efficiency β. Further by way of example, a high-power wide-area pump laser diode, such as a 10 W 63xx series Diode Laser for operating at 9xx nm having a 100 um emitting aperture that is available from JDSU Corp., may be required to operate, and be wavelength-stabilized, within a temperature range spanning $\Delta T=30$ degrees centigrade or greater, and with drive currents J that vary by as much as $\Delta J=12$ A, which results in the operation wavelength range 144 of up to 25 nm or greater, for typical values for the laser wavelength sensitivity $\lambda_0$ to temperature of ~0.3 nm/C.°, and to changes in the laser drive current of about 0.7-1.2 nm/A.

Thus, a grating of 10% reflectivity may not be able to stabilize the laser wavelength within the whole range of operating conditions that the laser may be subject to in accordance with operational requirements of a particular application, and a grating with a much greater peak reflectivity R may be required. Increasing the grating peak reflectivity has however the disadvantage of decreasing the useful output power P that is available downstream from the FBG 122. Moreover, it may be instead desirable to use a lower-reflectivity grating 122 to increase the useful output power P.

The inverse relationship between the useful output power from a semiconductor laser, and the range of operating conditions where the laser can be wavelength locked using an output grating such as the FBG 122, is not specific for FBG-stabilized lasers, but is also applicable to a multimode laser diode having a single-peak volume Bragg grating (VBG) disposed in the optical path of its output beam.

Figure 5:
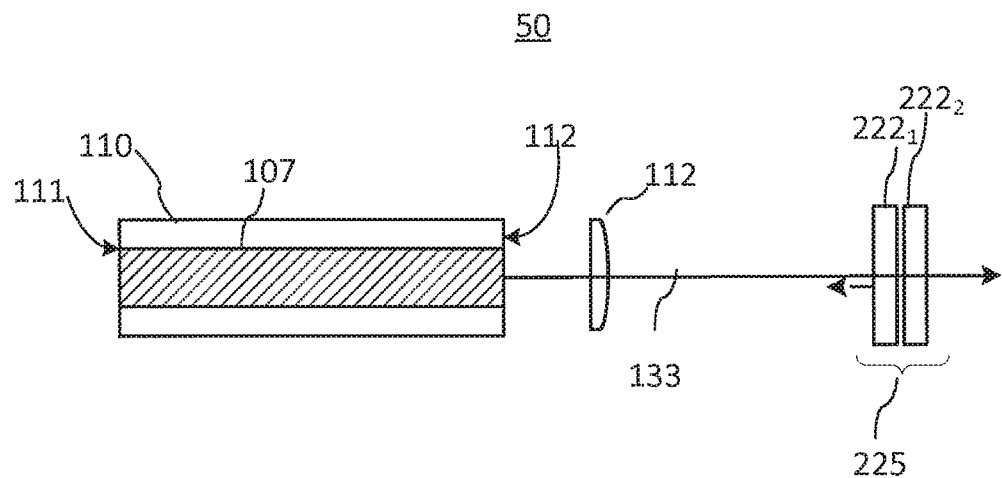
FIG. 5 is a schematic diagram illustrating a broad-area multi-mode semiconductor laser coupled to a multi-peak FBG for wavelength stabilization of the laser using bulk optics.

Referring now FIG. 5, an embodiment of the present invention provides a wavelength-stabilized light source 50, wherein the above mentioned drawbacks of the conventional FBG- or VBG-stabilized laser pump device are obviated, or at least mitigated, by using a multi-band partial reflector (MBPR) 225 disposed in the optical path of an output beam of a high-power multi-mode laser diode (LD) 110 having a wide active area 107, so as to provide the loss-reducing optical feedback to the LD 110 at two or more distinct reflection wavelengths $\lambda_i$; here i=1, 2, ..., N. Here and in the following, N is the number of reflectivity peaks in the reflection spectrum of the FBG 122. As illustrated, the MBPR 225 is in the form of two sequentially disposed VBGs $222_1$, $222_2$ having different grating periods.

Figure 6:
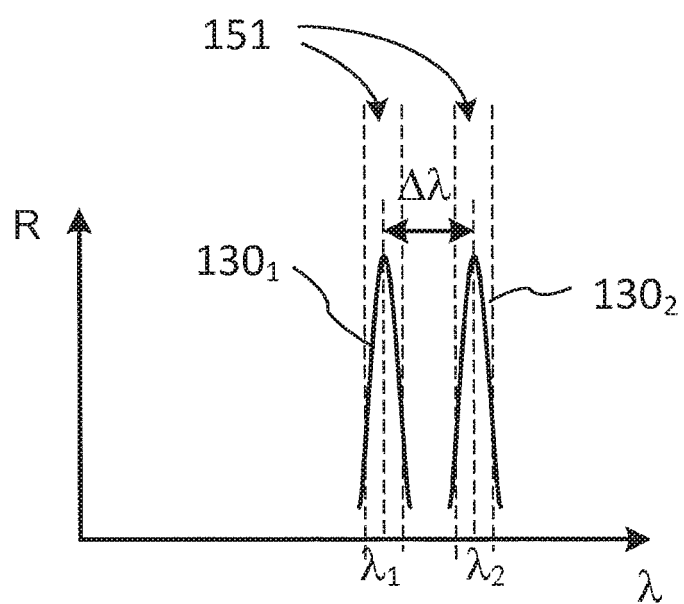
FIG. 6 is a schematic plot of a reflection spectrum of a dual-peak FBG.

Referring also to FIG. 6, the respective reflection peaks $130_1$ and $130_2$ of the VBGs $222_1$ and $222_2$ are centered at different reflection wavelengths $\lambda_1$ and $\lambda_2$, as defined by their respective grating periods, and are spaced apart from each other by a reflection peak spacing $\Delta\lambda=|\lambda_2-\lambda_1|$, which in typical embodiments may be for example in the range of 2 to 25 nanometers (nm). The respective reflection peaks $130_1$ and $130_2$ may be of a substantially same magnitude, or peak power reflectivity R, or may have somewhat different peak reflectivity, with the combined reflectivity of the MBPR 225 at wavelengths between the peaks being substantially lower, for example by 10 dB or more, than the peak reflectivities. FIG. 6 also schematically illustrates reflection bands 151 corresponding to the reflection peaks $130_{1,2}$, which may be defined as wavelength bands wherein the reflectivity is within X dB from the corresponding peak value, where 'X' can be for example 3 dB. Note that the VBGs $222_1$ and $222_2$ are optically coupled to the laser 110, using a suitable coupling lens or lenses 112, with about same coupling efficiency at their respective reflection wavelengths $\lambda_1$ and $\lambda_2$, so as to provide optical feedback into the laser 110 at each of these wavelengths.

It will be appreciated that the two VBGs $222_1$ and $222_2$ may be spaced apart or be adjacent to each other. The MBPR 225 may be for example in the form of a continuous Bragg grating formed in a single slab of material, with two different grating periods at different locations along the grating, or have a more complex grating structure that produces the desired multi-peak reflection spectrum, such as that shown in FIG. 6, with non-exclusive examples thereof being superstructure gratings and superimposed gratings. It will be thus also appreciated that two consecutive VBGs $222_1$ and $222_2$ is just one possible embodiment of a partially-transmissive multi-peak reflector having two distinct spatially separated reflection peaks.

By spreading the reflections wavelengths $\lambda_i$ within the operating wavelength range 144 in such a way that ensures wavelength locking of the laser radiation to one of these reflection wavelengths across the full range of operating conditions, laser wavelength stabilization may be achieved using gratings with lower peak reflectivities than would be required for the wavelength locking to a single reflection peak within the same operating range, thereby enabling greater output power for a same laser drive current.

By way of example, stabilizing a broad-area high-power pump 980 nm pump laser over a 30 C.° temperature range and for drive currents from 1 A to 15 A may require a 20%-30% peak relativity R in case of the conventional single-peak FBG or a single-peak VBG, which would lead to about 20% output power penalty as compared to the same laser without the output FBG. Using a two-peak reflector 225 with suitably selected reflection wavelengths enables to provide wavelength stabilization across the same range of operating conditions at about 10%-15% peak reflectivity, thereby reducing the output power penalty of wavelength stabilization by half. Using a three-peak MBPR with suitably selected reflection wavelengths enables to provide wavelength stabilization across the same range of operating conditions at about 7%-10% FBG reflectivity, thereby reducing the output power penalty of wavelength stabilization by up to two thirds. Generally, using an output reflector with N reflection peaks within the operating wavelength range of the laser enables to reduce the power penalty of the wavelength stabilization by up to N times compared to the power penalty of the wavelength stabilization using a conventional FBG having a single reflection peak within the operating wavelength range of the laser.

The trade-off for a greater output power when using a multi-peak reflector with the lower peak reflectivity is that the laser wavelength is allowed to switch between the two or more distinct wavelengths when the operating conditions change within the specified pre-defined range, rather than being locked to a single wavelength. However, at least for some practical applications requiring wavelength stabilization, any potential drawbacks that are associated with allowing the laser wavelength to switch between a few pre-defined wavelengths are more than overcome by the higher output power that is available from the laser due to the lower reflectivity of the output grating. In particular we found that the multi-wavelength stabilized high-power lasers, i.e. the high-power lasers which wavelength may change only by switching between a few pre-selected distinct wavelengths but is not allowed to vary continuously in-between, can still be used in applications wherein lasers which wavelength may continuously vary in a similar or wider range cannot be used, such as for example in optical power combining by means of wavelength multiplexing.

The pump laser source 50 of FIG. 5 is one example of such multi-wavelength stabilized light source, wherein a composite grating 225 formed of two single-period VBGs $222_{1,2}$ provides optical feedback at N=2 distinct wavelengths $\lambda_{1,2}$, defined by the respective grating reflectivity peaks $130_1$ and $130_2$. It will be appreciated that other embodiments may include three or more consecutive gratings $222_i$, or the composite grating 225 may be of a more complex structure that is designed to provide a desired number N≥2 of distinct reflection peaks centered at suitably selected reflection wavelengths $\lambda_i$, i=1, . . . , N within the pre-defined wavelength operating range of the device.

Generally, embodiments of the present invention may utilize any suitable partially-transmissive multi-band reflector which provides optical feedback to the multi-mode laser within two or more narrow reflection bands that are centered at suitably selected distinct reflection wavelengths $\lambda_i$, and have peak reflectivities in the range of 1 to 15% so as to transmit at least 80% of the incident laser power therethrough, or more preferably in the range of 2% to 10% so as to transmit about 90% or more of the incident optical power.

In general, the reflection wavelengths $\lambda_i$ of the MBPR 225 are preferably selected based on the pre-defined range of operating conditions of the laser, such as for pre-defined ranges ($\Delta T$, $\Delta J$) of the laser temperature T and drive current J, preferably so as to ensure that the laser exhibits a positive optical gain at least one of the reflection wavelengths within the full range of the operating conditions.

Figure 7:
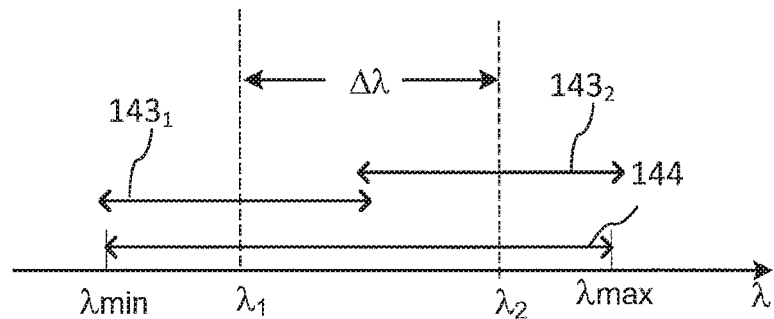
FIG. 7 is a diagram schematically illustrating wavelength locking ranges of a dual peak FBG relative to the operating wavelength range of the FBG-coupled semiconductor laser.

With reference to FIG. 7, the reflection wavelengths $\lambda_i$ may be selected to be spread within the operating wavelength range 144 of the laser 110, which spans from $\lambda_{min}$ to $\lambda_{max}$ and has a width $\Delta\lambda_{op}=|\lambda_{min}-\lambda_{max}|$, so that the free-running laser wavelength $\lambda_0$, or equivalently the gain peak wavelength $\lambda_G$ is within a wavelength locking range from at least one of the reflection wavelength $\lambda_i$. This requires that the total width $\Sigma_i(\Delta\lambda_{lock})$ of the wavelength locking ranges $143_i$ associated with the reflection wavelengths $\lambda_i$ is at least equal or just greater than $\Delta\lambda_{op}$, or equivalently that the average width $\Delta\lambda_{lock}$ of the wavelength locking ranges $143_i$ is at least equal or just greater than $\Delta\lambda_{op}/N$. When the operating condition change so that the gain peak wavelength $\lambda_G$, or equivalently the free-running laser wavelength $\lambda_0$, moves from being within the locking range of one reflection wavelength, for example the locking range $143_1$ associated with the reflection wavelength $\lambda_1$, to being within the locking range of another reflection wavelengths, for example the locking range $143_2$ associated with the reflection wavelength $\lambda_2$, the laser wavelength jumps from the first to the second reflection wavelength, e.g, from $\lambda_1$ to $\lambda_2$.

FIGS. 6 and 7 illustrate the dual-peak case, i.e. N=2, wherein the reflectivity R of the reflection peaks $130_1$ and $130_2$ is selected so that the locking range $\Delta\lambda_{lock}$ per reflection wavelength $\lambda_i$ is equal or just greater than half of the operating wavelength range $\Delta\lambda_{op}$. Here we assume for clarity of the description that each reflection peak 130i has the same reflectivity, although multi-peak reflectors having reflection peaks of somewhat different reflectivities are also within the scope of the invention.

In one embodiment, the reflection wavelengths $\lambda_i$ may be selected so that the lower boundary $\lambda_{min}$ of the operating wavelength range 144 is just within the locking range $143_1$ of the smallest reflection wavelengths $\lambda_1$, while the upper boundary $\lambda_{max}$ of the operating wavelength range 144 is just within the locking range $143_2$ of the largest reflection wavelengths $\lambda_2$, and the spacing $\Delta\lambda$ between two adjacent reflection wavelengths $\lambda_i$, $\lambda_{i+1}$ is equal or, preferably, somewhat smaller than the locking range width $\Delta\lambda_{lock}$. In some embodiments, the peak reflectivities for the reflection peaks 130i may be selected so that the total width $\Sigma=\Sigma_i(\Delta\lambda_{lock})$ of the wavelength locking ranges $143_i$ of the reflection peaks 130i is at least equal or somewhat greater than the operating wavelength range or the laser.

It may be desirable, at least in some applications, to limit the number N of wavelengths where the laser may be locked to while reducing the peak reflectivity R of the external reflector to an acceptable level. Therefore, for a given range of operating conditions, and therefore a given operating wavelength range $\Delta\lambda_{op}$, the selection of the reflection wavelengths $\lambda_i$ may include a trade-off between the number N of the corresponding reflection peaks and their peak reflectivity R, wherein a decrease in a desired R may require a greater N, and vice versa.

In one embodiment, the selection of the reflection wavelengths $\lambda_i$ may include the following steps: A) determining the operating wavelength range 144 of the laser 110 for a target application; B) determining a suitable number N of reflection peaks $130i$ within the operating wavelength range for the target application; C) determining a minimum locking range based on A) and B); D) based on the minimum locking range found in C), determining the peak reflectivity for each of the N reflection peaks $130i$; and, E) selecting the reflection wavelengths $\lambda_i$ so that the wavelength locking ranges $143_i$ associated with the reflection wavelengths fully cover the whole wavelength operating range $144$ of the laser.

In some embodiments, the selection of the reflection wavelengths $\lambda_i$ may start with selecting the peak reflectivity value R, for example based on laser power requirements of the target application, and then proceed to determining the wavelength locking range based on the selected value of R. The number of reflection wavelengths and their position may be determined from the condition that the respective wavelength locking ranges $143_i$ fully cover the whole wavelength operating range $144$ of the laser; or, equivalently, that the laser will be locked to at least one of the reflection wavelengths $\lambda_i$ across the whole pre-defined range of operating conditions. The number of reflection wavelengths N may be determined for example by dividing the wavelength operating range width $\Delta\lambda_{op}$ by the wavelength locking range width $\Delta\lambda_{lock}$.

In some embodiments, the reflection wavelengths $\lambda_i$ may be selected from a pre-defined set of wavelengths, and their corresponding peak reflectivities selected so that the locking ranges $143i$ associated therewith fully cover the full operating wavelength range $144$.

The MBPR $225$ formed of volume Bragg gratings $222_{1,2}$ of FIG. 5 is one example of a frequency-selective reflector that can be used to wavelength-stabilize a multi-mode semiconductor laser based light source by providing a desired level of optical feedback to the laser or lasers at two or more suitably selected wavelengths $\lambda_i$. Generally, embodiments of the present invention may use any partially-transmissive frequency-selective reflector composed of one or more bulk optical elements, including but not limited to VBGs, which reflection spectrum within the pre-defined operating wavelength range has two or more narrow reflection peaks of desired amplitudes. Such reflectors are generally referred to herein as multi-band partial reflectors (MB-PRs). In different embodiments, each reflectivity peak $130_i$ may be characterized by a peak reflectivity in the range of 1% to 15%, so that the MBPR, when disposed in the optical path of the multi-mode laser beam, transmits therethrough at least 80% of the beam and reflects back between 1% and 15% of the light at the at least two distinct reflection wavelengths.

Advantageously, the use of bulk optical components such as VBGs in MBPR enables sharing a same output MBPR for simultaneous multi-wavelength wavelength of two or more high-power multi-mode semiconductor lasers in multi-laser light sources.

Figure 8:
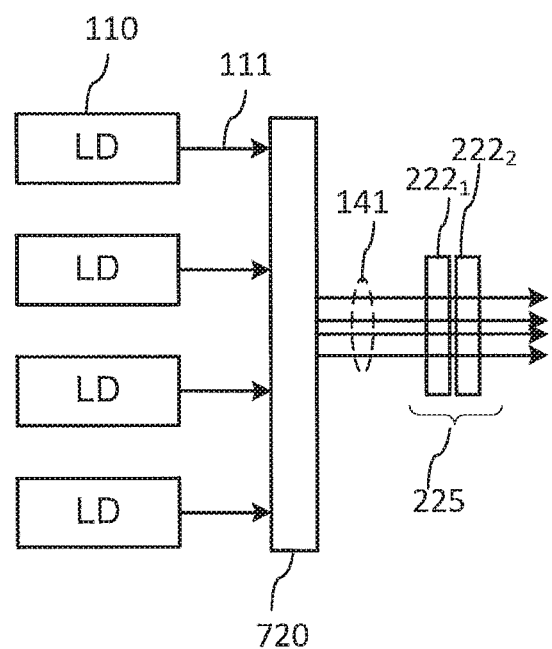
FIG. 8 is a schematic diagram illustrating a multi-laser light source having a multi-band partial reflector at the output for multi-band wavelength stabilization.

Turning now to FIG. 8, there is illustrated a general block diagram of a multi-laser light source $700$ wherein a plurality of K multi-mode laser diodes (LDs) $110$ are wavelength-stabilized using a same MBPR $225$. Multi-mode light beams $111$ generated by the LDs $110$ are combined in a single combined or composite beam $141$ using beam combining optics $720$. The MBPR $225$, which is disposed in the optical path of the composite beam $141$, preferably transmits therethrough at least 80% of the optical power of the beam $141$, and reflects back between 1% and 15% of the incident light power at the selected reflection wavelengths $\lambda_i$.

In the shown embodiment, MBPR $225$ is again in the form of two single-peak VBGs $222_1$ and $222_2$ having the reflection spectrum generally as illustrated in FIG. 6. It will be appreciated that in some embodiments MBPR $225$ may include three or more VBGs, or may be in the form of a single multi-band VBG having the desired multiple reflection peaks $130i$ within the operating wavelength range of the device. FIG. 8 shows four LDs $110$, i.e. K=4, by way of example only; it will be appreciated that the number K of LDs $110$ in the device of FIG. 8 may be greater or smaller than shown in the figure. It will be further appreciated that the device of FIG. 8 may also include beam collimating and/or focusing optics as known in the art, which is not shown in FIG. 8 in order not to obscure the drawing with known elements that may not be essential to understanding of features of the present invention.

The beam combining optics $720$ may be in the form of a single optical element or may include multiple elements. Although not required for operation of the device, in preferred embodiments the combining optics $720$ is such that light of each LD $110$ that is reflected from the MBPR $225$ is fed back substantially only into the same LD $110$ that generated that light, and not into the other LDs $110$, with the purpose of maximizing optical feedback into the LDs for a given MBPR reflectivity. In such embodiments the reflection properties of the MBPR $225$ may be substantially as described hereinabove with reference to FIGS. 5-7. Embodiments with feedback-induced cross-coupling between the LDs $110$, as would happen for example if the combining optics $720$ includes a beam mixer such as a length of multi-mode fiber, are also within the scope of the present invention, and would require an MBPR with a stronger peak reflectively to provide a same level of optical feedback into each laser.

Figure 9:
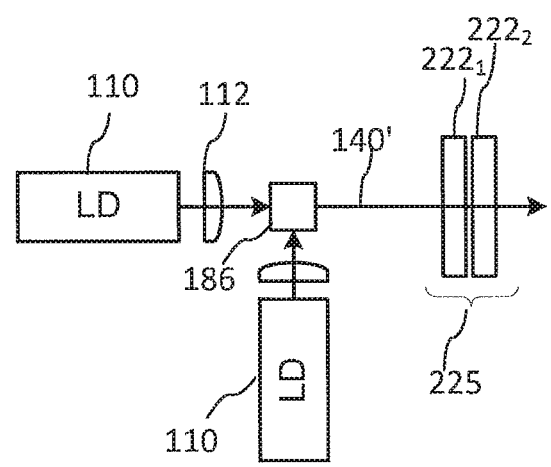
FIG. 9 is a schematic diagram illustrating a multi-laser polarization combined light source having a multi-band partial reflector at the output for multi-band wavelength stabilization.

Referring to FIG. 9, there is illustrated an embodiment $701$ of the multi-laser device $700$ wherein light from two LDs $110$ is combined into a single composite beam $140'$ using a polarization combiner $186$, and the MBPR $225$ is disposed in the optical path of the combined beam $140'$ to provide the wavelength stabilization of the lasers $110$ at the two or more reflection wavelengths $\lambda_i$ as described hereinabove. In this embodiment, light beams of each LD $110$ in the composited beam $140'$ have orthogonal polarizations and substantially overlap spatially. The polarization combiner $186$ may include a polarization converter for converting the polarization of light of one of the LDs $110$ to an orthogonal one. FIG. 9 also shows collimating lenses $112$ that are disposed in the optical path of the LD beams to collimate them prior to passing through the beam combiner $186$. The two LDs $110$ share the same MBPR $225$, which provides optical feedback to each the LDs.

Figure 10:
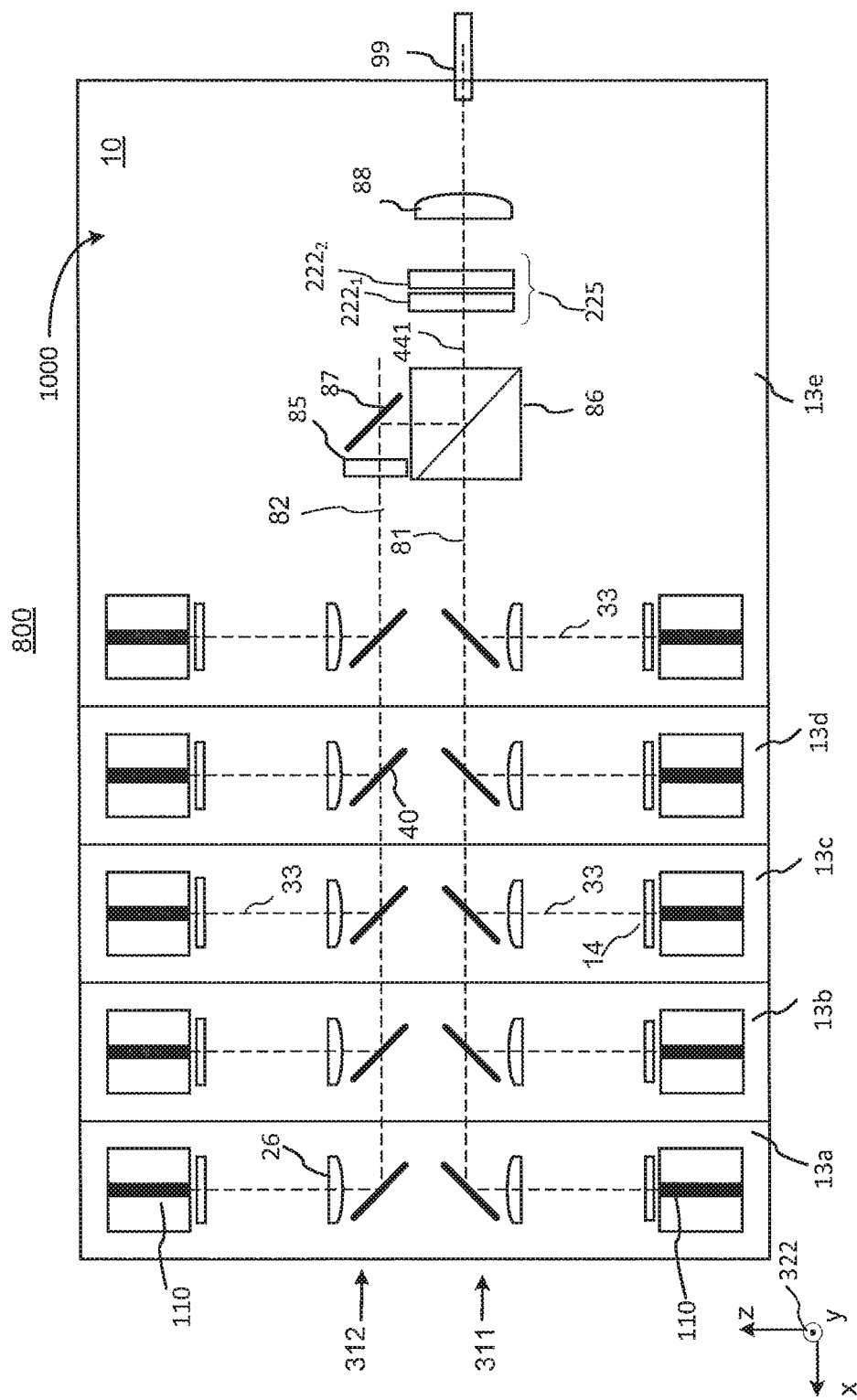
FIG. 10 is a schematic plane view of an exemplary multi-laser light source with laser beam stacking and multi-band wavelength stabilization.
Figure 11:
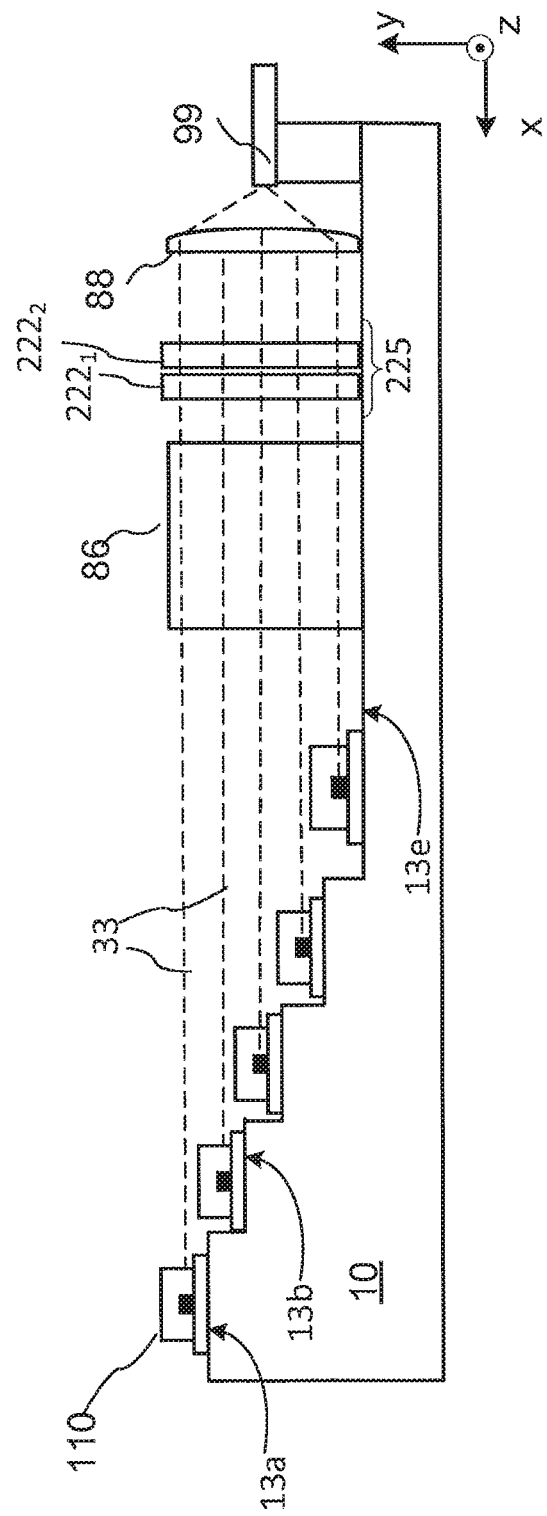
FIG. 11 is a schematic side view of the exemplary multi-laser light source of FIG. 10.
Figure 12:
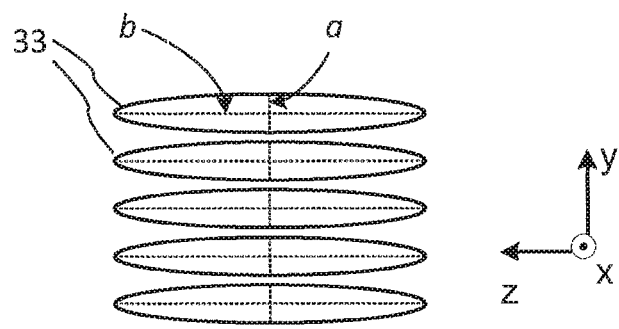
FIG. 12 is a schematic diagram illustrating a cross-section of the composite laser beams in the multi-laser light source of FIGS. 10 and 11.

Referring now to FIGS. 10 and 11, there is illustrated, in plan and side views respectively, a multi-laser device $800$ wherein collimated multi-mode light beams $33$ from a plurality of K=10 LD's $110$ are combined into a composite output beam $441$ by "layering" them one over the other. Within the composite output beam $441$, the collimated light beams $33$ from the K individual lasers $110$ are aligned in a vertical plane and stacked one over another, e.g. as illustrated in FIG. 12, so that the individual laser beams $33$ within the composite beam $441$ are vertically offset from each other. The multi-laser device $800$ is similar to the beam combining devices disclosed in U.S. Pat. No. 8,427,749 and U.S. Pat. No. 8,437,086 that are incorporated herein by reference, but is modified by the addition of the MBPR $225$ in the optical path of the combined beam $441$, as shown in the figures and described hereinbelow.

In one embodiment, the semiconductor lasers $110$ are high-power multi-mode LDs having a wide active area; they produce laser beams $33$ which, after the collimation, are substantially elliptical and highly non-circular in cross-section, with the beam dimension a in the vertical direction, i.e. normal to the laser substrate, being typically much smaller than the beam dimension b in the horizontal dimension, as illustrated in FIG. 12. One advantage of the multi-laser device 800 is that it enables to "stack" many such wide and thin light beams to form a single composite beam that can be coupled into a multimode fiber using a single lens.

In one embodiment, the support based 10 has a stepped laser-mounting face 1000 comprised of a plurality of parallel but vertically offset laser mounting surfaces 13a, 13b, ..., 13e forming steps of the stepped laser-mounting face 1000, which are generally referred to herein as the steps 13. The LDs 110 are mounted upon the steps 13 at the plurality of vertically offset levels 13a, 13b, .... The laser beams 33 generated by the LDs 110 of the light source 800 are therefore spatially offset from each other in the vertical direction, and are also referred to herein as the vertically offset beams 33. In FIGS. 10-12, the horizontal plane is the (x,z) plane of the Cartesian coordinate system 322, which is also the plane of semiconductor lasers substrates, and the vertical direction is the direction that is normal thereto and to the laser mounting surfaces 13a, 13b, ..., 13e, and is along the y-axis of the coordinate system 322.

In the shown embodiment the lasers 110 are arranged in two rows, and within each row are mounted in the vertically offset levels on different steps 13 of the stepped face 1000 of the support 10, with one laser 110 from each laser row per step or level. Within each row, the lasers 110 are spread so as to enable efficient heat dissipation.

Light beams 33 from lasers in each row are aligned in a same vertical plane (y,z) using beam aligning optics in the form of turning mirrors 40, so as to form two polarized composite beams 81, 82. As illustrated in FIG. 12, each of the composite beams 81, 82 is comprised of a plurality of K/2=5 laser beams 33 that are vertically offset but aligned in the plane of the support base, i.e. which projections on the plane (x, z) of the support base 10 are aligned along a same line. These two polarized composite beams may then be polarization-combined into the single output composite beam 441 using a polarization combiner 86, and a polarization converter 85 and a turning mirror 87 that are disposed in the optical path of one of the polarized composite beams 81, 82.

Beam collimating optics may also be provided to collimate each laser beam 33 prior to combining them into the composite beams 81 and 82. In the shown embodiment this beam collimating optics includes two lenses 14 and 26 per each laser 110, where lens 14 is for collimating the laser beam 33 in the vertical direction, i.e. normal to the laser substrate wherein the laser beam has the greater divergence (y-axis), while lens 26 is for collimating the laser beam in the horizontal direction, i.e. in the plane of the substrate (x-axis), wherein the divergence angle of the laser beam is considerably smaller.

Further details relating to the design and properties of the multi-laser device 800, except for those related to MBPR 225, may be found in U.S. Pat. No. 8,427,749 and U.S. Pat. No. 8,437,086, both of which are incorporated herein by reference.

The device of FIGS. 10 and 11 may be modified in several ways, for example by removing the beam combining optics 85-87 and adding a second MBPR output port, so as to output the composited beams 81, 82 separately, with a second MBPR disposed in the optical path of the second composite beam 82. In another embodiment, only one row of the lasers 110 may be present, for example the lower row in FIG. 10 that generates the composite beam 81, in which case beam 81 will be the only output beam. Furthermore, one skilled in the art will appreciate that the MBPR 225 may be added at the output of other multi-laser light sources disclosed in U.S. Pat. Nos. 8,427,749 and 8,437,086 to affect the multi-wavelength stabilization of their optical output in accordance with principals of the present invention.

The MBPR 225, which has at least two distinct narrow reflectivity peaks or bands centered at least two distinct reflection wavelengths $\lambda_i$ as generally described hereinabove, is disposed in the optical path of the output composite beam 441. By way of example, MBPR 225 transmits therethrough at least 80% of the composite beam, and reflects back between 1% and 15% of light at the at least two distinct wavelengths $\lambda_i$; the peak reflectivity of each reflectivity peak may be for example between 1% and 15%, or preferably between about 2% and 10%, and have a FWHM width of about 1 nm or less and preferably about 0.5 nm or less. The light of each laser 110 that is reflected back by the MBPR 225 is returned back to the same laser 110 that generated it, re-tracing its optical path from the laser to the MBPR in the opposite direction, substantially without coupling into other lasers 110. Thus, the same MBPR 225 provides separate optical feedback at the two or more distinct reflection wavelengths $\lambda_i$ to each of the lasers 110 of the device simultaneously. The portion of the composite beam 441 that is transmitted through the MBPR may then be optionally coupled into an output fiber-optic port 99 using coupling optics 88, or in another embodiment delivered to a desired destination using bulk optics.

In the shown embodiment, MBPR 225 is in the form of two single-peak reflectors $222_1$ and $222_2$, each of which may be embodied for example as a volume Bragg grating (VBG). It will be appreciated from the foregoing description that in some embodiments MBPR 225 may include three or more VBGs, or may be in the form of a single multi-band VBG having the desired multiple reflection peaks within the operating wavelength range of the device. Furthermore, FIG. 10 shows K=10 LDs 110, five in each row, by way of example only; it will be appreciated that the number of LDs in each row of the device of FIG. 10 may be greater or smaller than shown in the figure, so that the total number of LDs K may be greater or smaller than shown in the figure.

The multi-laser device of FIGS. 10 and 11 may be viewed as an embodiment of the multi-laser device 700 of FIG. 8 wherein the LDs 110 are disposed at different levels, and the beam combining optics 720 is provided by the turning mirrors 40, which may also be referred to as the beam aligning mirrors. It will be appreciated therefore that various aspects and features that are described hereinabove and hereinbelow with reference to device 700 of FIG. 8, or embodiments thereof, are also applicable to the device 800 of FIGS. 10 and 11.

Figure 13:
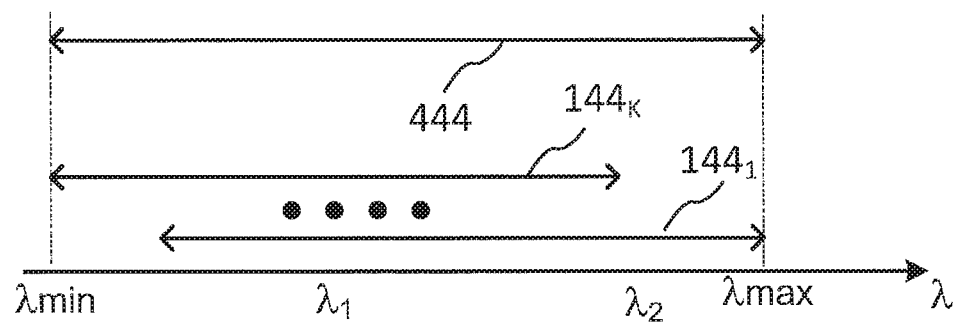
FIG. 13 a diagram schematically illustrating an operating wavelength range of the multi-laser light source of FIGS. 10 and 11.

In some embodiments, each of the plurality of LDs 110 in the device 700 or 800 is of a substantially same layer structure and nominal material composition, or comprises a semiconductor chip of a substantially same layer structure and nominal material composition. In other embodiments, LDs 110 of the device 700 may include lasers designed to emit at different wavelengths. Nevertheless, the LDs 110 of the device 700, even if nominally of the same design and material composition, may slightly differ from each other due to manufacturing tolerances. For example, laser chips may differ from each other due to uncontrollable material variations across a semiconductor wafer from which they were produced, or from wafer to wafer. Therefore, the operating wavelength ranges of the LDs 110 in the device 700 or 800 may be shifted in wavelength with respect to each other for the same pre-defined range of operating conditions. This is schematically illustrated in FIG. 13 by double-sided arrows $144_1$ and $144_K$, which represent the wavelength operating ranges of the shortest-wavelength and the longest-wavelength LDs 110 of the device 800 or 700.

In accordance with one or more aspects of the present invention, one method of selecting the reflection wavelengths $\lambda_i$ and the peak reflectivities $R_i$ includes the following general steps: a) determining the overall operating wavelength range 444 of the light source for the pre-defined range of operating conditions in the absence of the wavelength stabilization; and, b) selecting the reflection wavelengths $\lambda_i$, i=1, ..., N, within the operating wavelength range of the light source and the corresponding peak reflectivity values R of the reflection peaks 130i so that wavelength locking ranges 143i associated with the reflection peaks 130i fully cover the whole wavelength operating range 444 of the light source.

The overall wavelength operating range 444 of the multi-laser device, which is also referred to herein as the effective wavelength rage of the device, may be defined as a union of the wavelength operating ranges $144_1, ..., 144_K$ of all LDs 110 in the device, i.e. the totality of all wavelengths that lie within the operating wavelength ranges of at least one of the constituent LDs 110. The wavelength operating range 444 of the multi-laser light source is generally wider than the operating wavelength ranges $\lambda\lambda_{op}$ of individual LDs 110 by a factor of $w=\Delta\lambda_{total}/\Delta\lambda_{op}$, wherein $\Delta\lambda_{total}$ is the width of the wavelength operating range 444 of the multi-laser device.

In one embodiment, the overall wavelength operating range 444 of the multi-laser light source 700 or 800 may be determined by first determining the operating wavelength ranges 144 for each of the plurality of LDs 110 in the multi-laser light source, and then determining the operating wavelength range 444 of the light source based on the operating wavelength ranges 144 of the plurality of semiconductor lasers, e.g. as the union thereof.

The reflection wavelengths $\lambda_i$ of the MBPR 225 are preferably selected so that each of the lasers 110 of the respective multi-laser light source exhibits positive optical gain at least one of the reflection wavelengths $\lambda_i$ over the pre-defined range of operating conditions. In at least one embodiment, the reflection wavelengths $\lambda_i$ of the MBPR 225 are selected so as to enable wavelength locking of each of the LDs 110 at one of the reflection wavelengths $\lambda_i$ at any operating condition within the pre-defined range of operating conditions, for example at any operating temperature and injection current within the pre-defined operating ranges thereof. Referring again to FIG. 13, this may be achieved by selecting the reflection wavelengths $\lambda_i$ to be suitably spread within the wavelength operating range 444 of the multi-laser light source 700 or 800. In one embodiment, the corresponding peak reflectivity values $R_i$ of the reflection peaks are selected so that the wavelength locking ranges associated with reflection wavelengths $\lambda_i$ continually cover the wavelength operating range 444 of the device. Accordingly, methods of selecting the reflections wavelengths $\lambda_i$ and the corresponding peak reflectivity values $R_i$ that are described hereinabove in the context of the wavelength stabilization of a single LD 110 and with reference to FIGS. 5-7 may be used also in the context of the wavelength stabilization of the multi-laser device 700 of FIG. 8, while substituting the overall wavelength operating range 444 of the multi-laser light source for the wavelength operating range 144 of a single laser.

The overall wavelength operating range $[\lambda_{min}, \lambda_{max}]$ 444 of the multi-laser light source 700 or 800 may be determined for example from laser characterization data for the individual LDs 110 of the device, such as by measuring the laser wavelength for each LD 110 of the device at the lowest-wavelength and the highest-wavelength boundaries of the pre-defined range of operating conditions for the device so as to obtain 2K measured wavelength values, and then assigning the smallest and the largest of the 2K measured wavelength values to $\lambda_{min}$ and $\lambda_{max}$, respectively. For example, in one embodiment the lower boundary $\lambda_{min}$ of the overall wavelength operating range $[\lambda_{min}, \lambda_{max}]$ 444 of the multi-laser light source 700 or 800 may be determined as the lowest among the laser wavelengths of the K LDs 110 of the device measured at the lowest operating temperature and the lowest drive current specified for the device, while the higher boundary $\lambda_{max}$ of the wavelength operating range $[\lambda_{min}, \lambda_{max}]$ 444 may be determined as the lowest among the laser wavelengths of the K LDs 110 of the device measured at the lowest operating temperature and the lowest drive current specified for the device. In one embodiment, $\lambda_{min}$ may be slightly decreased, and $\lambda_{max}$ slightly increased to account for measurement inaccuracies.

It will also be appreciated that the widening of the effective operating wavelength range 444 in the case of the multi-laser device compared to the single-laser devices by the factor of m may also require a corresponding increase in the locking ranges $\Delta\lambda_{loc}$ by the same factor m, for the same number of reflection peaks N within the operating wavelength range 444 of the device, in order to ensure that each of the LDs is locked to at least one of the reflection wavelengths of the MBPR 225 within the whole range of the operating conditions. Alternatively, the number of the reflection peaks N in the reflection spectrum of the MBPR 225 within the effective wavelength range 444 of the device may be increased. Furthermore, since the wavelength position $\lambda_G$ of the optical gain peak may vary between the LDs 110, different LDs 110 of a same multi-laser device 700 or 800 may be locked to different reflection peaks $130_i$, and thus generate light at different reflection wavelengths at certain operating conditions, e.g. certain combinations of the laser temperature T and the laser drive current J within the pre-defined range of operating conditions.

In one embodiment, once the peak reflectivity values R for the reflection peaks 130i of the MBPR 225 have been chosen, and the minimum width of the corresponding wavelength locking ranges 143 for the LDs 110 has been determined, the process of selecting the reflection wavelengths $\lambda_i$ of the MBPR 225 may be include selecting the smallest of the reflection wavelengths $\lambda_i$, e.g. $\lambda_1$, so that it exceeds $\lambda_{min}$ by at most half of the minimum wavelength locking range width, and the largest of the reflection wavelengths $\lambda_i$, e.g. $\lambda_N$, so it is smaller than $\lambda_{max}$ by at most half of the minimum wavelength locking range width. By way of example, an optical feedback coefficient of 5%, which may correspond to about 10% peak reflectivity for a 50% feedback coupling efficiency into a laser, may provide a minimum locking range of 5 nm. In this case, to guarantee wavelength locking within an operating wavelength range of 10 nm or greater without increasing the peak reflectivity of the wavelength stabilizing reflector, an MBPR with multiple reflection peaks should be used. The lowest of the reflection wavelengths $\lambda_i$ may be selected to be about 2.5 nm higher than the lowest wavelength of the free-running lasers 110 at the lowest operation temperature and lowest driving current within the predefined operating range, while the highest of the reflection wavelengths $\lambda_i$ may be selected to be about 2.5 nm lower than the highest wavelength of the free-running lasers 110 at the highest operation temperature and highest driving current within the predefined operating range. The spacing between the reflection peaks 130$i$ may be selected to be about 5 nm. Choosing a lower reflectivity R will decrease the locking range at each reflection peak 130$i$, and the number of peaks N may have to be changed accordingly with the decreased peak spacing $\Delta\lambda$.

By way of example, the number of LDs K is the multi-laser device 700 or 800 may vary from 2 to 16 or greater, while the number of reflection peaks N may be in the range from 2 to 5, and more preferably 2 or 3.

In at least some applications, such as for example where achieving highest possible output power in a small footprint is desirable, it may be preferable to maximize the number of lasers K in one device; advantageously, this also enables to decrease the cost of adding the MBPR by sharing it between a large number of lasers. Accordingly, in such embodiments the number K of the LDs 110 in one multi-laser light source substantially exceeds the number N of the distinct reflection peaks of the MBPR within the operating wavelength range of the device, in some embodiments by a factor of 2, 3, or greater.

Advantageously, limiting the optical spectrum of the output beam 141, 141' or 441 of the multi-laser light source 700 or 800 to a few pre-determined wavelength, as defined by the respective MBPR, enables combining optical outputs from several such devices in a single high-power optical beam by wavelength multiplexing.

Figure 14:
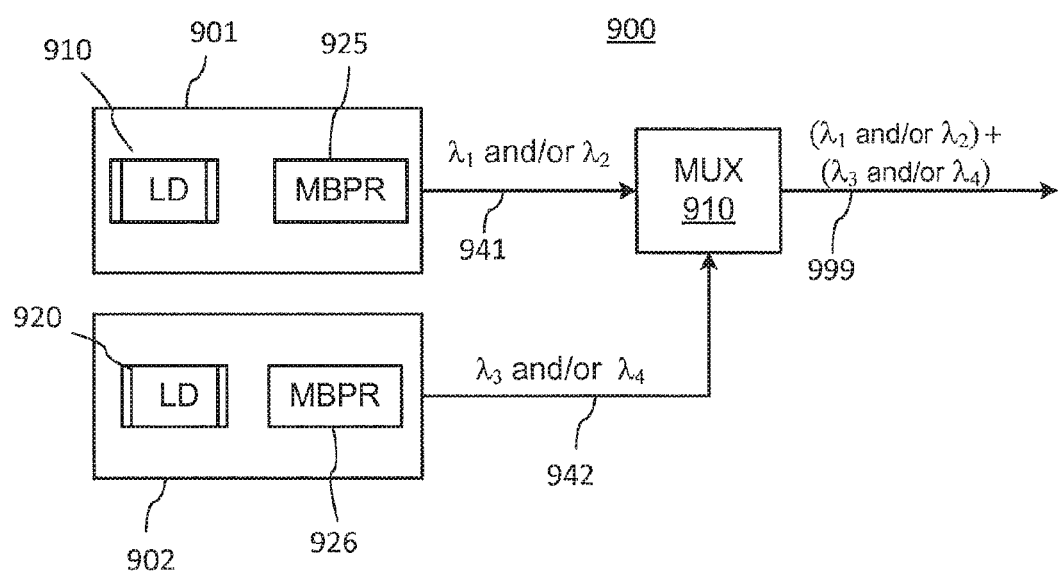
FIG. 14 is a diagram schematically illustrating wavelength multiplexing of two laser sources with wavelength stabilization using multi-band reflectors.

With reference to FIG. 14, in one exemplary embodiment a wavelength multiplexed light source 900 includes first and second light sources 901 and 902, which respective output optical beams 941 and 942 are combined into a single wavelength-multiplexed optical beam 999 using a wavelength multiplexer (MUX) 910. Each of the first and second light sources 901, 902 may be embodied as described hereinabove with reference to FIGS. 5-12. The first light source 901 includes one or more semiconductor lasers 910, such as the high-power multi-mode LDs 110 for generating the first output beam 941, and further includes an MBPR 925 that is disposed in the optical path of the first output beam 941 for multi-wavelength stabilization thereof by providing optical feedback to the first semiconductor laser or lasers 910 at two or more first reflection wavelengths that lie within the operating wavelength range of the light source 901. The second light source 902 includes one or more second semiconductor lasers 920, such as the high-power multi-mode LDs 110, for generating the second output beam 942, and further includes an MBPR 926 that is disposed in the optical path of the second output beam 942 for multi-wavelength stabilization thereof by providing optical feedback to the second semiconductor laser or lasers 926 at two or more second reflection wavelengths that lie within the operating wavelength range of the second light source 902. In one exemplary embodiment, each of the light sources 901 and 902 may be embodied as the multi-laser light source 800 as generally described hereinabove. The multiplexed light beam 999 combines the output light beams 941 and 942, and may include one or two wavelengths from the reflection wavelengths of each of the MBPR 925 and MBPR 926.

According to an aspect of the present invention, in order to enable the wavelength multiplexing of the output beams 941 and 942, the MBPRs 925 and 926 of the first and second sources 901 and 902 have different reflection wavelengths, so that each of the first reflection wavelengths $\lambda 1_i$, i=1, ..., N1 of the MBPR 925 of the first light source 901 differs from each of the second reflection wavelengths $\lambda 2_j$, j=1, ..., N2 of the MBPR 926 of the second light source 902.

Figure 15A:
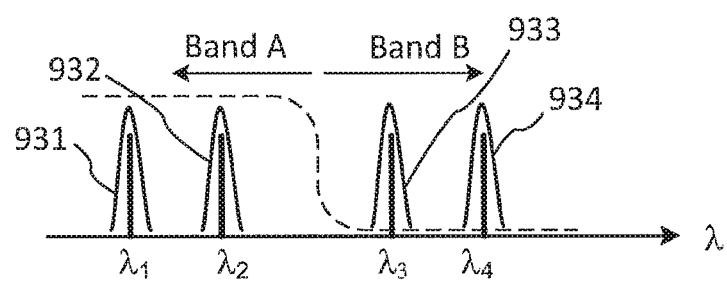
FIGS. 15A and 15B are schematic diagram illustrating two different selections of reflection wavelengths in the wavelength multiplexing of FIG. 14.

In one embodiment, the reflection wavelengths $\lambda 1_i$, i=1, ..., N1 of the MBPR 925 and the reflection wavelengths $\lambda 2_j$, j=1, ..., N2 of the MBPR 926 may be selected from two non-overlapping wavelength bands, and the MUX 910 may be in the form of a bandpass multiplexer, which transfer characteristic is schematically illustrated in FIG. 15A by a dashed curve, and which combines light in the two non-overlapping wavelength bands 'A' and 'B' received at two different input ports into the wavelength multiplexed light beam 999.

Figure 15B:
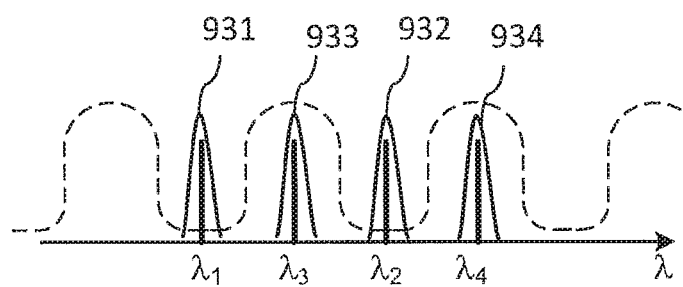

In one embodiment, the first reflection wavelengths $\lambda 1_i$, i=1, ..., N1 of the MBPR 925 and the second reflection wavelengths $\lambda 2_j$, j=1, ..., N2 of the MBPR 926 may be selected from odd and even wavelengths, respectively, of a sequence of uniformly spaced wavelengths $\lambda_n$, n=1, 2, 3, .... The MUX 910 is in the form of an interleaving multiplexer, which receives the odd and even wavelengths of the sequence of wavelengths $\lambda_n$, n=1, 2, 3, ..., at two different input ports, and combines them in an interleaving way to obtain the wavelength multiplexed beam 999. As known in the art, an interleaving multiplexer may be embodied using a three-port comb filter which transfer characteristic is schematically illustrated in FIG. 15B by a dashed curve.

By way of example, each of the light sources 901 and 902 may be embodied as the multi-laser light source 700 or 800 as generally described hereinabove. Further by way of example and as indicated in FIG. 14, 15A or 15B, the reflection spectrum of the MBPR 925 of the source 901 may have two reflectivity peaks 931, 932 centered at the first reflection wavelengths $\lambda_1$ and $\lambda_2$, while the reflection spectrum of the MBPR 926 of the source 902 may have two reflection peaks 933, 934 centered at second reflection wavelengths $\lambda_3$ and $\lambda_4$. The reflectivity wavelengths $\lambda_1 \neq \lambda_2 \neq \lambda_3 \neq \lambda_4$ of the two MBPRs are spaced apart, and the wavelength spacings between these wavelengths are selected so as to enable the wavelength multiplexing, for example by at least 1 nm or more preferably by at least 2 nm. As described hereinabove, the reflectivity peaks 931, 932, and 933, 934 and the corresponding reflection wavelengths $\lambda_1, \lambda_2$ and $\lambda_3, \lambda_4$ of the MBPRs 925 and 926 may be selected either to be grouped together as schematically illustrated in FIG. 15A, or to interleave along the wavelength axis as schematically illustrated in FIG. 15B.

Depending on operation conditions, in operation the optical power of the output beam 941 of the first light source 901 may be concentrated at one or both of the $\lambda_1$ or $\lambda_2$, e.g. it can be divided between these wavelengths. The latter case may occur, for example, when two different LDs 110 of the light source 901 are locked to two different reflection wavelengths $\lambda_1, \lambda_2$ due to differences in the wavelength $\lambda_G$ of the gain peak of the respective LDs. Similarly, the optical power of the output beam 942 of the second light source 902 may be concentrated at one of the $\lambda_3$ or $\lambda_4$, or be divided between these wavelengths.

It will be appreciated that one or both of the MBPRs 925, 926 may have more than two reflection wavelengths so as to provide wavelength-locking optical feedback at three or more reflection wavelengths.

In at least some embodiments, one or both of the light sources 901 and 902 is/are in the form of the multi-laser device 700 of FIG. 8. In one embodiment, each of the light sources 901, 902 is in the form of the multi-laser device 800 as illustrated in FIGS. 10 and 11, or a modification thereof, with the optical output beams 941, 942 being composite optical beams composed of stacked beams of individual semiconductor lasers, as illustrated in FIG. 12. One advantage of the multi-laser device 800 is that it enables to combine optical power from many, e.g. 10 or more, high-power LDs 110 within a single beam. However, the number K of LDs 110 in the device 700 is still limited by design considerations, such as the beam quality of the collimated laser beams 33 from individual LDs 110. The use of MBPRs 225 or 925 with suitably chosen reflection wavelengths $\lambda_i$ enables obtaining optical beams 999 of even greater optical power by combining light from two or more wavelength-stabilized multi-laser light sources 800 by wavelength multiplexing, while advantageously substantially reducing the power-lowering penalty that is associated with the wavelength locking in its conventional, single-wavelength implementations.

An aspect of the present invention relates to a method of producing a high-power light beam by wavelength multiplexing, which includes the following general steps:

a) combining multi-mode laser beams from a plurality of first multi-mode semiconductor lasers 910 to produce a first multi-mode composite light beam 941;

b) combining multi-mode laser beams from a plurality of second multi-mode semiconductor lasers 920 to produce a second multi-mode composite light beam 942;

c) disposing a first MBPR 925 in the optical path of the first multi-mode composite light beam 941 for providing an optical feedback to each of the plurality of first multi-mode semiconductor lasers 910 at least two first reflection wavelengths $\lambda 1_i$, i=1, . . . , N1 that are spaced apart by at least 2 nm, wherein the at least two first reflection wavelengths and corresponding peak reflectivities of the first MBPR 925 are selected so as to ensure wavelength locking of each of the first semiconductor lasers 910 at one of the at least two first reflection wavelengths $\lambda 1_i$ at any operating condition within a pre-defined range of operating conditions;

d) disposing a second MBPR 926 in the optical path of the second multi-mode composite light beam 942 for providing an optical feedback to each of the plurality of second multi-mode semiconductor lasers 920 at least two second reflection wavelengths $\lambda 2_i$, i=1, . . . , N2 that are spaced apart by at least 2 nm, wherein the at least two second reflection wavelengths $\lambda 2_i$ and corresponding peak reflectivities of the second MBPR 926 are selected so as to ensure wavelength locking of each of the second semiconductor lasers 920 at one of the at least two second reflection wavelengths $\lambda 2_i$ at any operating condition within the pre-defined range of operating conditions, wherein each of the at least two first reflection wavelength $\lambda 1_i$ is spaced apart from each of the at least two second reflection wavelengths $\lambda 2_i$ so as to enable wavelength multiplexing of the first and second reflection wavelengths; and, e) providing a wavelength multiplexer 910 disposed to receive the first and second multi-mode composite light beams to produce therefrom the high power light beam by means of wavelength division multiplexing of the first and second multi-mode composite light beams.

The peak reflectivities of the first or second MBPR 9125, 926 may be selected generally as described hereinabove with reference to the light sources 700, 800 and 900. In one embodiment of the method, the peak reflectivities of the first or second MBPR 9125, 926 are selected for providing a wavelength locking range 143 that is smaller in width than an operating wavelength range of each of the first or second lasers 910, 920 over the predefined range of operating conditions.

In one embodiment of the method, the plurality the multi-mode semiconductor lasers of at least one of the light sources 901, 902 may include at least two lasers 910 or 920 having different peak gain wavelengths $\lambda_G$ at same operating conditions, while the peak reflectivities of the respective first or second MBPR 925 or 926 may be such that, at some operating conditions within the pre-defined range, the at least two lasers are wavelength locked to two different reflection wavelengths of the respective MBPR, so that the respective composite multi-mode beam 941 or 942 includes the at least two different wavelengths.

Various approaches to selecting the reflection wavelengths $\lambda_i$ within the operating wavelength range have been described hereinabove with reference to different embodiments illustrated in FIGS. 5, 8, 10, 11 and 14, and further with reference to FIGS. 7 and 13. Furthermore it will be appreciated that at least in some embodiments, the choice of the wavelength to lock to, and therefore the choice of the reflection wavelengths $\lambda_i$ is at least in part limited by a particular application wherein the light source is to be used. For example, one possible application of the light sources of FIGS. 5, 8-11, and 14 is to pump a solid state laser or amplifier, such as a fiber laser or amplifier, in which case the reflection wavelengths $\lambda_i$ should be within a desired absorption peak or peaks of the material to be pumped. By way of example, an Ytterbium-doped fiber laser has a narrow and strong absorption peak at 976 nm and a broader absorption peak around 915 nm. For pumping this fiber laser, the reflection wavelengths $\lambda_i$ may be selected within the fiber laser absorption bands, for example at 976 nm and 915 nm.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

We claim:

1. A multi-laser light source comprising:
a plurality of multi-mode semiconductor lasers;
beam combining optics for combining multi-mode laser beams emitted by the plurality of multi-mode semiconductor lasers into a combined multi-mode beam; and
a multi-band partial reflector (MBPR) disposed in an optical path of the combined multi-mode beam for transmitting therethrough at least 80% of an optical power of the combined multi-mode beam,
the MBPR having a structure defined by at least two distinct reflectivity peaks centered at at least two distinct reflection wavelengths,
each reflectivity peak characterized by a peak reflectivity, in a range of 1% to 15%, for providing an optical feedback to each of the plurality of multi-mode semiconductor lasers at the at least two distinct reflection wavelengths, and
wherein the at least two distinct reflection wavelengths and corresponding distinct reflectivity peak, of the at least two distinct reflectivity peaks, are selected such that the structure of the MBPR produces the at least two distinct reflectivity peaks:
based on a determination of an operating wavelength range, which is based on a respective wavelength operating range for each of the plurality of multi-mode semiconductor lasers, of the multi-laser light source for a pre-defined range of operating conditions,
based on a selection of reflection wavelengths, within the operating wavelength range of the multi-laser light source, and corresponding peak reflectivity values, of the at least two distinct reflectivity peaks, so that wavelength locking ranges, associated with the at least two distinct reflectivity peaks, cover the operating wavelength range, and to enable wavelength locking of each of the plurality of multi-mode semiconductor lasers at one of the at least two distinct reflection wavelengths at any operating condition within the pre-defined range of operating conditions.

2. The multi-laser light source of claim 1, further comprising:
a support base having a stepped laser mounting surface comprising a plurality of steps, wherein
the plurality of multi-mode semiconductor lasers are mounted upon the plurality of steps for producing the multi-mode laser beams,
the multi-mode laser beams are spatially offset from each other in a vertical direction that is perpendicular to the stepped laser mounting surface;
the beam combining optics align the vertically offset multi-mode laser beams in a same vertical plane so as to form a composite light beam; and
the at least two distinct reflection wavelengths and the corresponding distinct reflectivity peak, of the at least two distinct reflectivity peaks, are selected so that each of the plurality of multi-mode semiconductor lasers exhibits an optical gain peak within a wavelength locking range from at least one of the at least two distinct reflection wavelengths over the pre-defined range of operating conditions.

3. The multi-laser light source of claim 1, wherein
the pre-defined range of operating conditions comprises pre-defined operating ranges of laser temperature and drive current, and
the at least two distinct reflection wavelengths and the corresponding peak reflectivity values are selected so as to enable wavelength locking of each of the plurality of multi-mode semiconductor lasers at one of the at least two distinct reflection wavelengths at any temperature and drive current within the pre-defined operating ranges.

4. The multi-laser light source of claim 1, wherein each of the plurality of multi-mode semiconductor lasers comprises a laser chip of a substantially same layer structure and nominal material composition.

5. The multi-laser light source of claim 1, wherein a quantity of multi-mode semiconductor lasers, of the plurality of multi-mode semiconductor lasers, is greater than a quantity of distinct reflectivity peaks of the at least two distinct reflectivity peaks.

6. The multi-laser light source of claim 1, wherein the MBPR comprises at least two volume Bragg gratings (VBG) for reflecting light at a respective distinct reflection wavelength of the at least two distinct reflection wavelengths.

7. The multi-laser light source of claim 1, wherein the MBPR comprises a multi-band VBG having a reflection spectrum comprising the at least two distinct reflectivity peaks.

8. The multi-laser light source of claim 1, wherein each of the at least two distinct reflectivity peaks is characterized by a peak reflectivity between 2% and 15%.

9. The multi-laser light source of claim 1, wherein the at least two reflection wavelengths are spaced apart by at least 2 nm.

10. A method comprising:
combining multi-mode laser beams emitted by a plurality of multi-mode semiconductor lasers into a combined multi-mode beam;
providing a multi-band partial reflector (MBPR) having at least two distinct reflectivity peaks centered at at least two distinct reflection wavelengths within an operating wavelength range of a multi-laser light source, each reflectivity peak characterized by a peak reflectivity in the range of 1% to 15%; and
disposing the MBPR in an optical path of the combined multi-mode beam for transmitting therethrough at least 80% of an optical power of the combined multi-mode beam, and for providing an optical feedback to each of the plurality of multi-mode semiconductor lasers at the at least two distinct reflection wavelengths;
wherein the at least two distinct reflection wavelengths and corresponding distinct reflectivity peak, of the at least two distinct reflectivity peaks, are selected:
based on a determination of an operating wavelength range, which is based on a respective wavelength operating range for each of the plurality of multi-mode semiconductor lasers, of the multi-laser light source for a pre-defined range of operating conditions,
based on a selection of reflection wavelengths, within the operating wavelength range of the multi-laser light source, and corresponding peak reflectivity values, of the at least two distinct reflectivity peaks, so that wavelength locking ranges, associated with the at least two distinct reflectivity peaks, cover the operating wavelength range, and
to enable wavelength locking of each of the plurality of multi-mode semiconductor lasers at one of the at least two distinct reflection wavelengths at any operating condition within the pre-defined range of operating conditions.

11. The method of claim 10, further comprising:
determining the operating wavelength range of the multi-laser light source for the pre-defined range of operating conditions in an absence of wavelength stabilization.

12. The method of claim 11, wherein determining the operating wavelength range of the multi-laser light source includes:
determining operating wavelength ranges for each of the plurality of multi-mode semiconductor lasers; and
determining the operating wavelength range of the multi-laser light source based on the operating wavelength ranges of the plurality of multi-mode semiconductor lasers.

13. The method of claim 11, wherein determining the operating wavelength range of the multi-laser light source includes:
determining a minimum wavelength as a low-wavelength boundary of the operating wavelength range of a lowest-wavelength multi-mode semiconductor laser of the plurality of multi-mode semiconductor lasers;
determining a maximum wavelength as a high-wavelength boundary of the operating wavelength range of a highest-wavelength multi-mode semiconductor laser of the plurality of multi-mode semiconductor lasers; and
determining the operating wavelength range of the multi-laser light source as spanning from the minimum wavelength to the maximum wavelength.

14. The method of claim 10, further comprising:
selecting the reflection wavelengths by:
- selecting peak reflectivity values for the at least two distinct reflection peaks of the MBPR;
- determining a minimum wavelength locking range for the multi-mode semiconductor lasers for the selected peak reflectivity values; and
- selecting the reflection wavelengths so that a smallest of the reflection wavelengths exceeds a minimum wavelength by at most half of the minimum wavelength locking range and the largest of the reflection wavelengths is smaller than a maximum wavelength by at most half of the minimum wavelength locking range.

15. The method of claim 10, wherein the MBPR comprises at least two volume Bragg gratings (VBG) for reflecting light at a respective distinct reflection wavelength of the at least two distinct reflection wavelengths.

16. The method of claim 10, wherein the MBPR comprises a multi-band VBG having a reflection spectrum comprising the at least two distinct reflectivity peaks.

* * * * *